United States Patent
Bhagwat et al.

(10) Patent No.: US 10,353,001 B2
(45) Date of Patent: Jul. 16, 2019

(54) RAPID SCAN TESTING OF INTEGRATED CIRCUIT CHIPS

(71) Applicant: Seagate Technology LLC, Cupertino, CA (US)

(72) Inventors: Rajesh Maruti Bhagwat, Pune (IN); Nitin Satishchandra Kabra, Pune (IN); Jay Shah, Ahmedabad (IN)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 121 days.

(21) Appl. No.: 15/611,047

(22) Filed: Jun. 1, 2017

(65) Prior Publication Data

US 2018/0348298 A1    Dec. 6, 2018

(51) Int. Cl.
   *G01R 31/28* (2006.01)
   *G01R 31/3177* (2006.01)
   *G01R 31/317* (2006.01)
   *G01R 31/3185* (2006.01)

(52) U.S. Cl.
   CPC ... *G01R 31/3177* (2013.01); *G01R 31/31703* (2013.01); *G01R 31/31723* (2013.01); *G01R 31/318544* (2013.01)

(58) Field of Classification Search
   CPC .......... G01R 31/3177; G01R 31/31703; G01R 31/31723; G01R 31/31813; G01R 31/319; G01R 31/318544
   USPC ......... 714/726–729, 732–734, 736, 738–739
   See application file for complete search history.

(56) References Cited

U.S. PATENT DOCUMENTS

| | | | |
|---|---|---|---|
| 6,065,145 A | 5/2000 | Bencivenga | |
| 6,438,722 B1 * | 8/2002 | Bailey | G01R 31/319 714/736 |
| 6,684,358 B1 * | 1/2004 | Rajski | G01R 31/31813 714/728 |
| 6,694,466 B1 * | 2/2004 | Tsai | G01R 31/31854 714/728 |
| 7,665,001 B2 | 2/2010 | Baik et al. | |
| 7,853,846 B2 | 12/2010 | Cannon et al. | |

(Continued)

OTHER PUBLICATIONS

Galke, C. et al., "Embedded Scan Test with Diagnostic Features for Self-Testing SoCs", Proceedings of the 12th IEEE International On-Line Testing Symposium (IOLTS'06), 0-7695-2620-9/06 $20.00 (c) 2006 IEEE, IEEE Computer Society, 2 pages.

*Primary Examiner* — Christine T. Tu
(74) *Attorney, Agent, or Firm* — Westman, Champlin & Koehler, P.A.

(57) ABSTRACT

A method of testing an IC chip having a plurality of programmable blocks and at least one memory. The method includes configuring a first programmable block of the plurality of programmable blocks with scan test logic for carrying out a scan test on other ones of the plurality of programmable blocks. The method further includes generating scan patterns and expected results for the scan test outside the IC chip. The generated scan patterns and expected results are loaded into the memory. The scan patterns from the memory are injected into the other programmable blocks. An output response of the other programmable blocks to the scan patterns is obtained. The output response is compared with the expected results by the scan test logic within the first programmable block. A scan test result based on the comparison between the output response and the expected results is provided.

18 Claims, 9 Drawing Sheets

(56) References Cited

U.S. PATENT DOCUMENTS

| | | |
|---|---|---|
| 7,925,465 B2 | 4/2011 | Lin et al. |
| 8,290,738 B2 | 10/2012 | Lin et al. |
| 8,386,866 B2 | 2/2013 | Chung |
| 8,423,845 B2 | 4/2013 | Hapke et al. |
| 8,578,226 B2 | 11/2013 | Chung |
| 9,086,459 B2 | 7/2015 | Guo et al. |
| 9,222,979 B2 | 12/2015 | Kim |
| 9,377,510 B2 | 6/2016 | Sonawane et al. |
| 9,395,414 B2 | 7/2016 | Sonawane et al. |

\* cited by examiner

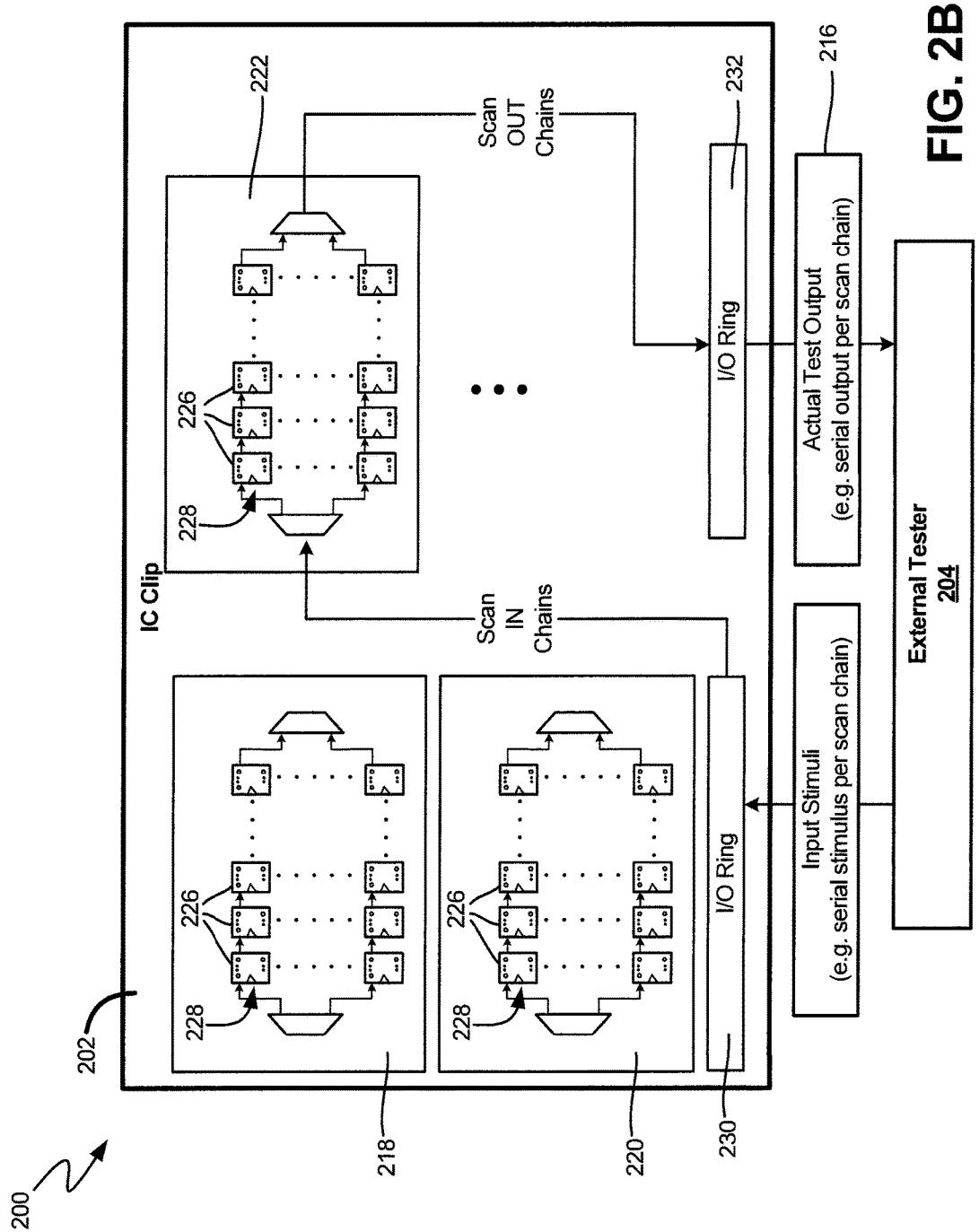

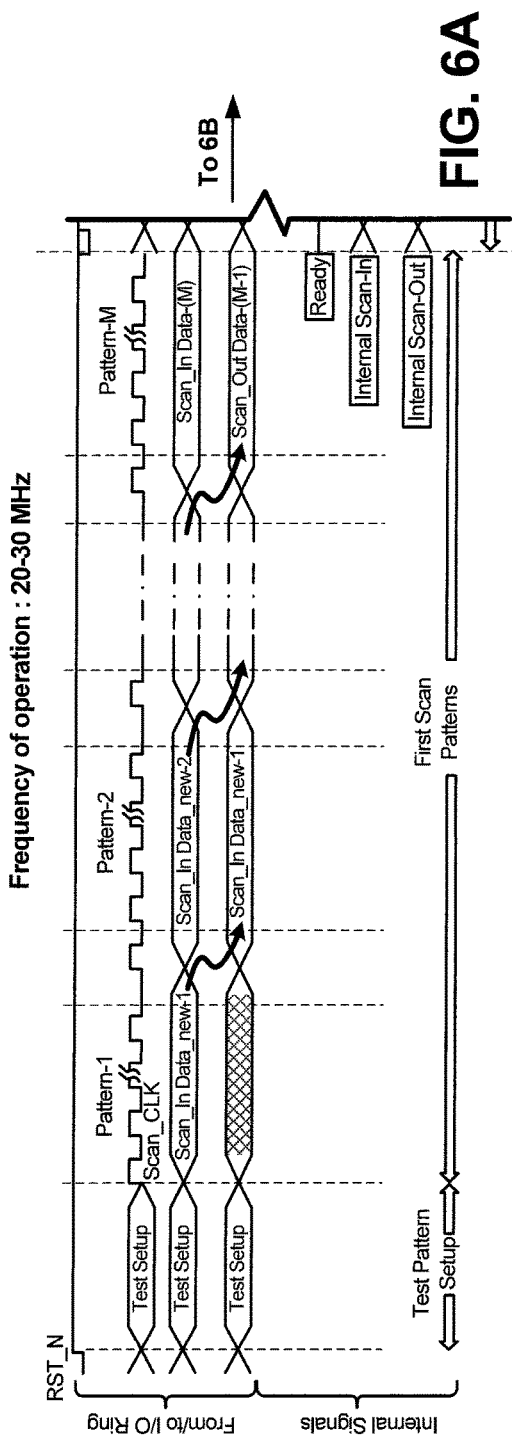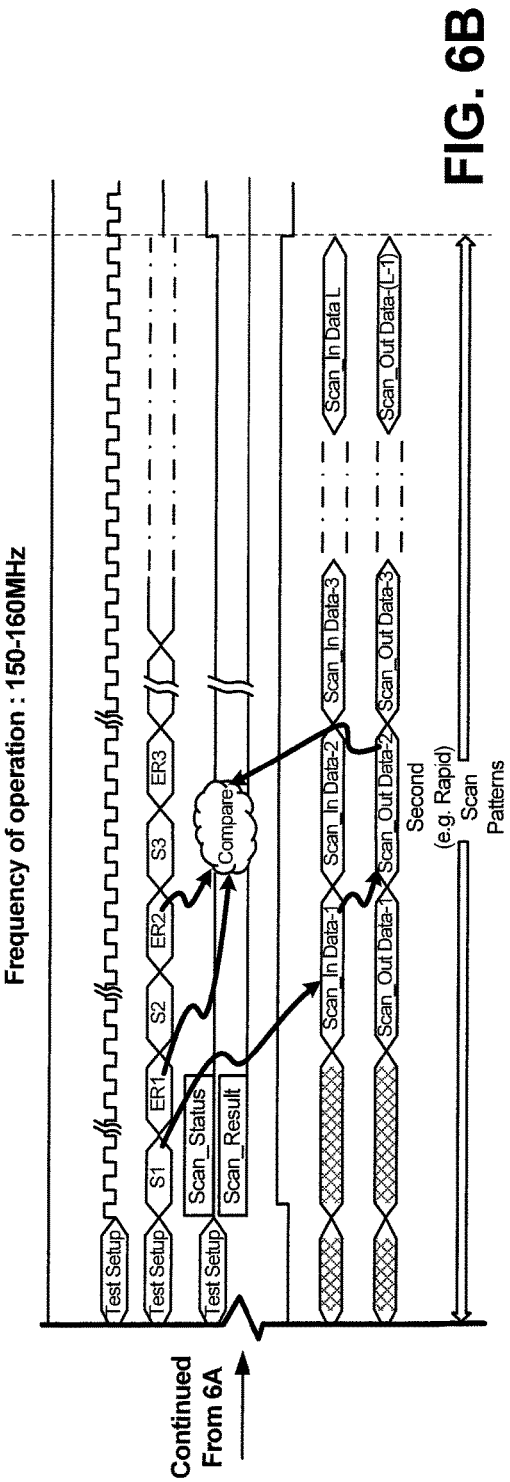

RAPID SCAN TESTING OF INTEGRATED CIRCUIT CHIPS

BACKGROUND

Complex integrated circuit (IC) chips (e.g., controller chips of data storage drives) have a number of components, which may include one or more memories (e.g., static random access memory (SRAM)). Current methods for testing such IC chips are relatively slow and costly.

SUMMARY

Embodiments of the disclosure relate to an integrated circuit (IC) chip scan testing method in which the IC chip's data storage and instruction-processing capabilities are exploited to speed up the test and thereby reduce cost.

In one embodiment, a method of testing an IC chip having a plurality of programmable blocks and at least one memory is provided. The method includes configuring a first programmable block of the plurality of programmable blocks with scan test logic for carrying out a scan test on other ones of the plurality of programmable blocks. The method further includes generating scan patterns and expected results for the scan test outside the IC chip. The generated scan patterns and expected results are loaded into the memory of the IC chip. The scan patterns from the memory are injected into the other programmable blocks. An output response of the other programmable blocks to the scan patterns is obtained. The output response is compared with the expected results by the scan test logic within the first programmable block of the IC chip. A scan test result based on the comparison between the output response and the expected results is provided.

This summary is not intended to describe each disclosed integrated circuit scan testing embodiment. Many other novel advantages, features, and relationships will become apparent as this description proceeds. The figures and the description that follow more particularly exemplify illustrative embodiments.

BRIEF DESCRIPTION OF THE DRAWINGS

FIG. 2B is a block diagram of the first IC chip scan test setup of FIG. 2A with additional IC chip details.

FIGS. 6A and 6B are example timing diagram portions showing scan patterns applied to an IC chip and corresponding scan chain outputs for a second scan test according to the method of FIG. 4.

DETAILED DESCRIPTION OF ILLUSTRATIVE EMBODIMENTS

Figure 1:
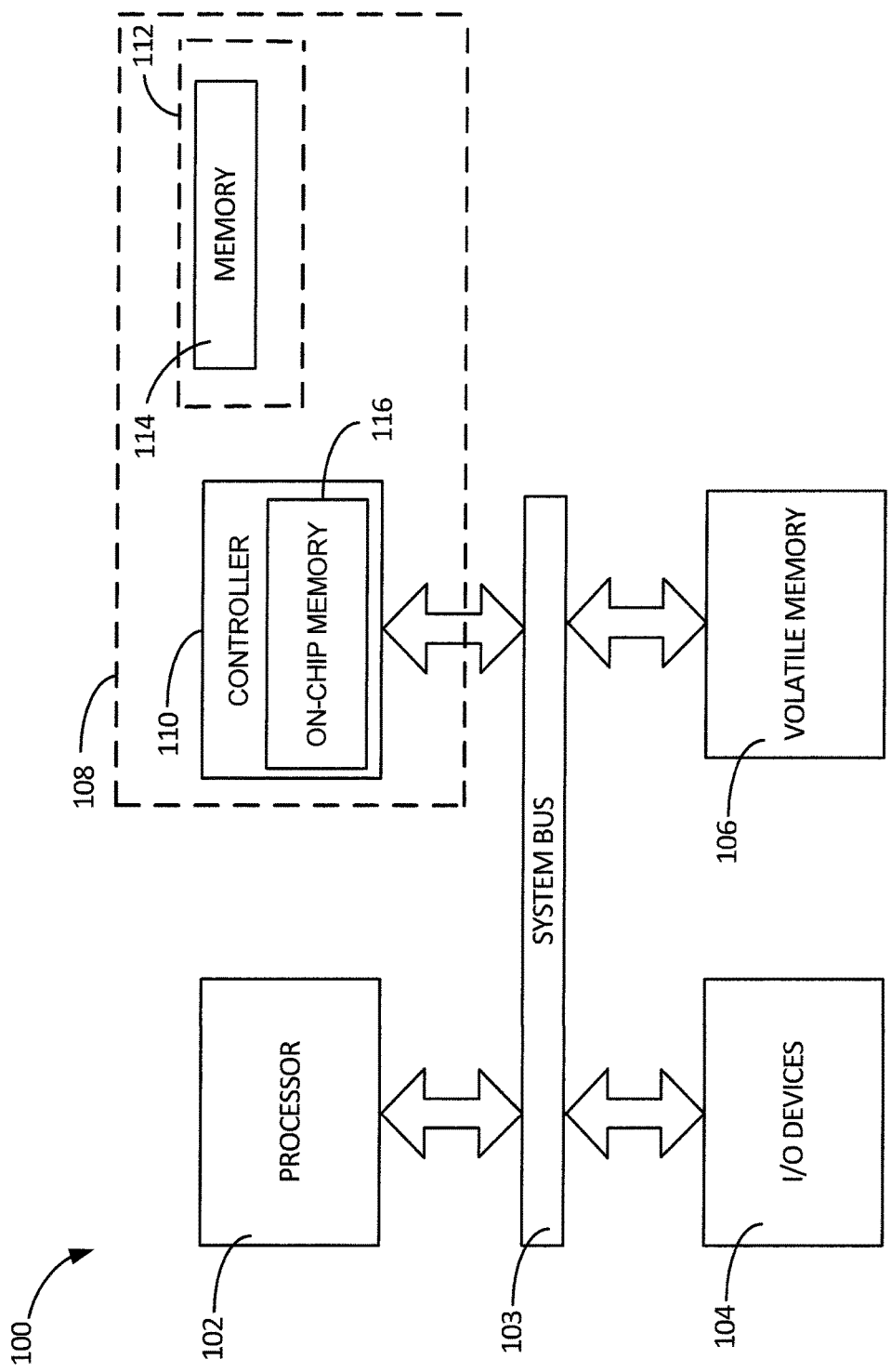
FIG. 1 is a simplified block diagram of an illustrative embodiment of a system of data storage management.

Embodiments of the disclosure are related to an integrated circuit (IC) chip scan testing method in which the IC chip's data storage and instruction-processing capabilities are exploited to speed up the test and thereby reduce its cost. However, prior to providing additional details regarding the different embodiments, a description of an illustrative operating environment in which IC chips tested by methods disclosed herein may be incorporated is provided below in connection with FIG. 1. The operating environment shown in FIG. 1 is for illustration purposes only. IC chips tested by methods of the present disclosure may be employed in any number of different types of operating environments.

Referring to FIG. 1, a particular embodiment of a system of data storage management is shown and generally designated 100. The system of data storage management 100 may include a processor 102 connected to a system bus 103 which also can be connected to input/output (I/O) devices 104, such as a keyboard, monitor, modem, storage device, or pointing device. The system bus 103 may also be coupled to a memory 106, which may be a random access volatile memory. The system bus may additionally be coupled to a memory device 108.

The memory device 108 may include a controller 110, which may be coupled to the processor 102 via a connection through the system bus 103. In one embodiment, the memory device 108 comprises at least one storage entity 112. Storage entity 112 may include one or more memories 114. In some embodiments, storage entity 112 may comprise a plurality of memories of various sizes and types.

During operation, the processor 102 may send commands and data to the memory device 108 to retrieve or store data. The controller 110 can receive the commands and data from the processor 102 and then manage the execution of the commands to store or retrieve data from storage entity 112. Controller 110 may be a complex IC that includes one or more on-chip memories (e.g., static random access memory (SRAM)) 116. Such a complex IC chip that integrates multiple components of an electronic system is known as a system-on-a-chip (SoC).

A SoC may be tested using a "scan testing" or "scan chain testing." Scan chains are inserted into IC chip designs to enable test data to be shifted into the chip and out of the chip. Insertion of scan chains into the IC chip makes points in the IC chip controllable and observable. A scan chain may be formed of a number of flip-flops connected in series with the output of one flip-flop in the chain connected to an input of the next flip-flop in the chain. An input of a first flip-flop in a scan chain may be connected to an input pin of the IC chip, and an output of a last flip-flop in the scan chain may be connected to an output pin of the IC chip. In a scan test, each scan chain undergoes a test operation.

As part of the test operation, an input stimulus that includes a scan pattern known as an input vector is injected into the scan chain via the IC input pin to which the first flip-flop of the scan chain is coupled. Data is shifted in and loaded to all flip-flops in the scan chain to complete a scan-in operation for that chain. The scan pattern is then shifted out to obtain a scan test output via the output pin connected to the last flip-flop of the scan chain. The scan test output is compared to an expected result. A mismatch between the scan test output and the expected result is indicative of a possible defect in the IC chip.

Figure 2A:
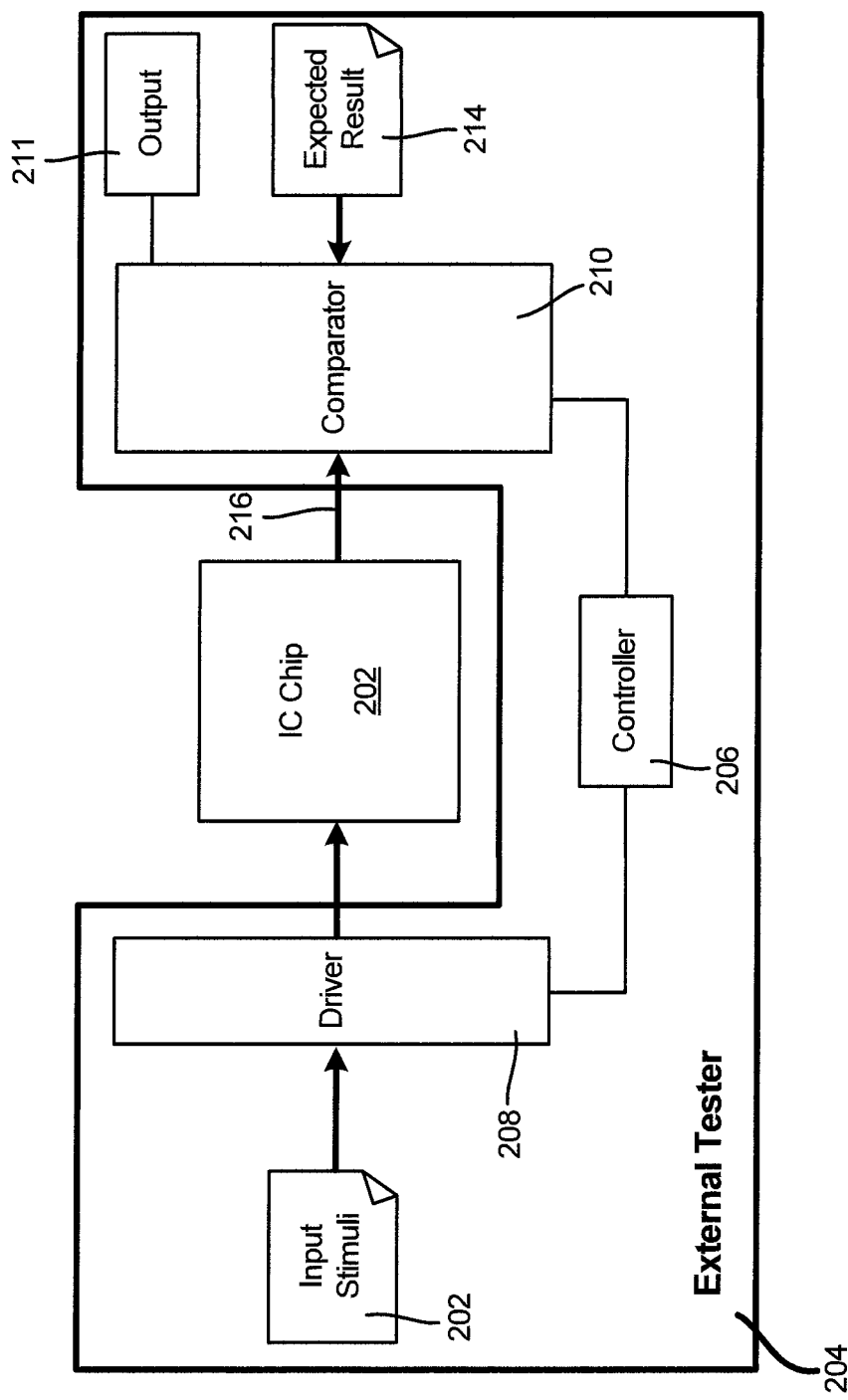
FIG. 2A is a simplified block diagram of a first integrated circuit (IC) chip scan test setup.

FIG. 2A is a simplified block diagram showing a first IC chip scan test setup 200. In first IC chip scan test setup 200, an IC chip 202 is coupled to an external chip tester 204 in a manner shown in FIG. 2A. External chip tester 204 includes a controller 206, a driver 208, a comparator 210 and a tester output 211. The controller 206 can receive scan test-related commands that are entered/selected by a user, and responsively carry out a scan test on the IC chip 202. Also, with the help of controller 206, input stimuli 212 and expected results 214 may be programmed into chip tester 204.

Carrying out a scan test using first IC chip scan test setup 200 involves injecting, by driver 208, input stimuli 212 into IC chip 202, and obtaining scan test outputs 216 from IC chip 202. The scan test outputs 216 are provided to comparator 210 of external chip tester 204. Comparator 210 compares the scan test outputs 216 and the expected results 214 and provides scan test results, which are indicative of a condition of the IC chip. The scan test results may be obtained by a user via tester output 211.

IC chip 202 may include a plurality of partitions or blocks (e.g., programmable blocks or programmable logic blocks, memories, etc.). FIG. 2B illustrates IC chip scan test setup 200 with IC chip 202 under test having a plurality of blocks 218, 220, 222, etc. Each of blocks 218, 220 and 222 includes flop-flops 226 connected together to form scan chains 228. In the interest of simplification, test connections to only block 222 are shown in FIG. 2B. In FIG. 2B, input/output (I/O) rings 230 and 232 represent I/O pins of the IC chip 202. Input stimuli (e.g., scan patterns) 212 are provided from external tester 204 to the IC chip 202 via I/O rings 230 and scan test outputs 216 are provided external tester 204 via I/O ring 234. External tester 204 utilizes the scan test outputs 216 to determine a scan test result in a manner described above in connection with FIG. 2A.

For a medium-complexity IC chip having 150 input/output (I/O) pins, a number of scan chains 228 employed for a scan test may be about 60. In first IC chip scan test setup 200 of FIGS. 2A and 2B, the different scan chains 228 are mapped to the different I/O pins or I?O ring 230 and 232 of the IC chip 202 and therefore all of the I/O pins of the IC chip 202 may be utilized for the scan test. About 20,000-30,000 scan patterns may be employed to achieve desired test coverage for the IC chip 202. Such a scan test may involve the utilization of about 70% of a total test capacity of external tester 204. Using the IC chip scan test setup 200, scan shifts may be carried out at a frequency of about 20-30 MHz. Tester time is a significant parameter in determining the cost of an IC chip, and the cost of testing an IC chip may be as high as 50% of the total cost of the chip.

Figure 3A:
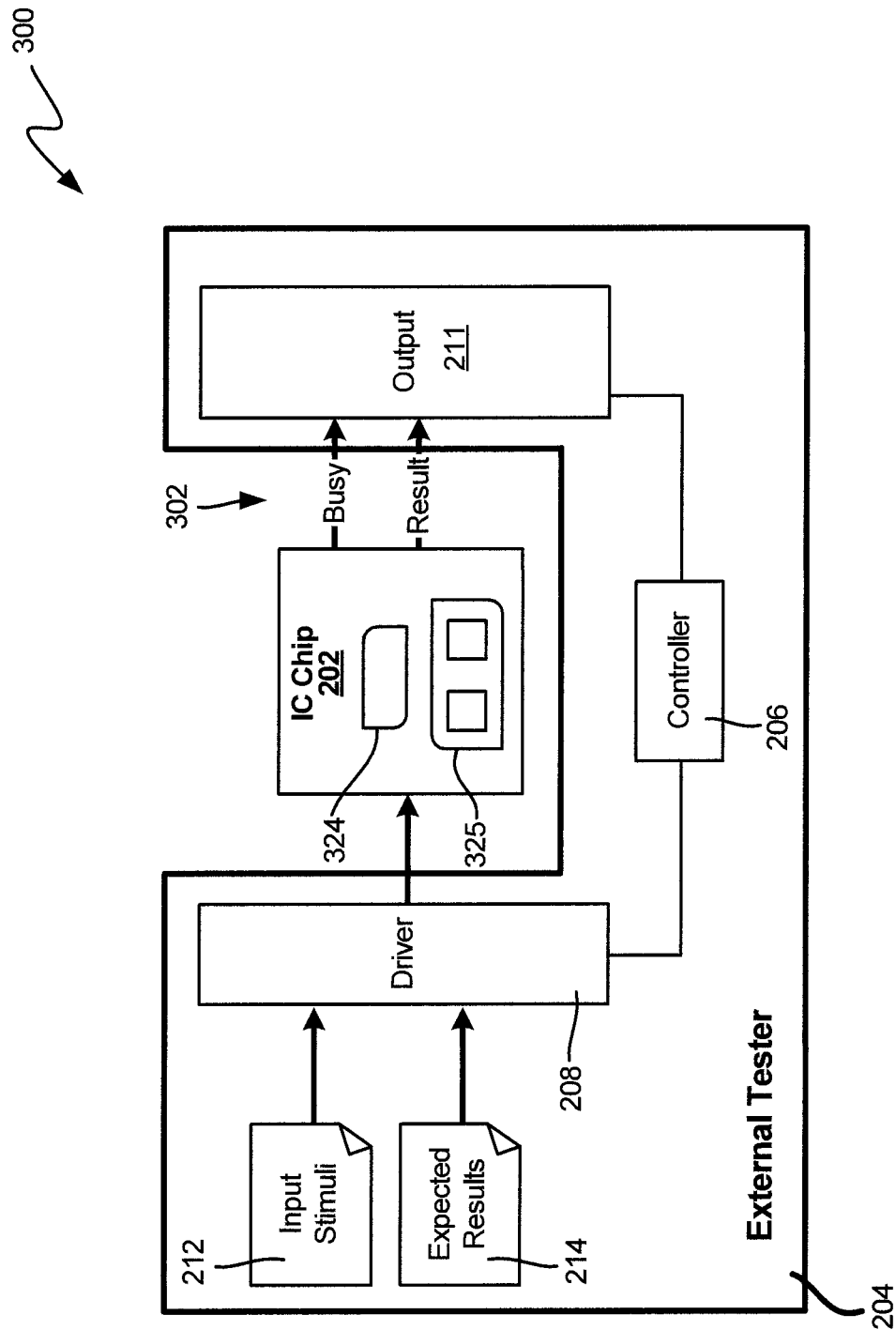
FIG. 3A is a simplified block diagram of a second IC chip scan test setup in accordance with one embodiment.

FIG. 3A is a simplified block diagram showing a second IC chip scan test setup 300 in accordance with one embodiment. In the second IC chip scan test setup 300, to address time- and/or cost-saving needs, the IC chip's instruction-processing capability and on-chip memory are exploited to provide functionality that enables input stimuli and expected patterns/results to be received in the IC chip and stored in the on-chip memory at relatively high speeds (e.g., 100 to 200 MHz frequency). Also, the IC chip's instruction-processing capability is utilized to read the input stimuli from the on-chip memory and pump the input stimuli into scan chains at a high speed (e.g., 150 to 200 MHz). Further, as the input stimuli are being pumped into the scan chains, scan test outputs from the scan chains that become available can be compared against expected results that are read from the on-chip memory. These comparisons take place within the IC chip, and scan test results based on the comparisons are also determined within the IC chip.

In FIG. 3A, a programmable block employed to provide the on-chip scan test logic is denoted by reference numeral 324 and the on-chip memory used to store the input stimuli 212 and the expected results 214 is denoted by reference numeral 325. Since, in the embodiment of FIG. 3A, comparisons between the scan test outputs and the expected results 214 take place within the IC chip 202, there is no need for the external tester to provide such functionality. Alternately, if the external tester 204 includes a comparator such as 210 (of FIGS. 2A and 2B), that comparator is not utilized in second IC chip scan test setup 300 shown in FIG. 3A. Accordingly, no comparator in shown in second IC chip scan test setup 300. As indicated above, in the embodiment of FIG. 3A, the input stimuli 212 and the expected results 214 are injected into the IC chip by tester driver 208 at a high speed, and substantially all the scan test functions are carried out within the IC chip 202. As can be seen in FIG. 3A, IC chip 202 provides a scan test result output 302 to external chip tester 204. External chip tester 204 makes the scan test results available to a user via output 211, which may be, for example, a monitor. In one embodiment, the IC chip 202 provides the scan test result to the external chip tester 204 by way of a two-bit vector. One of the two bits of the vector is a test status bit and the other bit is a result bit. An active high test status bit indicates that the IC chip 202 is busy, which means that the scan operation is in progress. When the test status bit is high, the result bit has no meaning. However, when the test status bit is low, an active high result bit indicates that the scan test was successful. When the test status bit is low, a low result bit indicates that the scan test failed. Details regarding different modules that carry out the different scan test operations within IC chip 202 are provided below in connection with FIG. 3B.

Figure 3B:
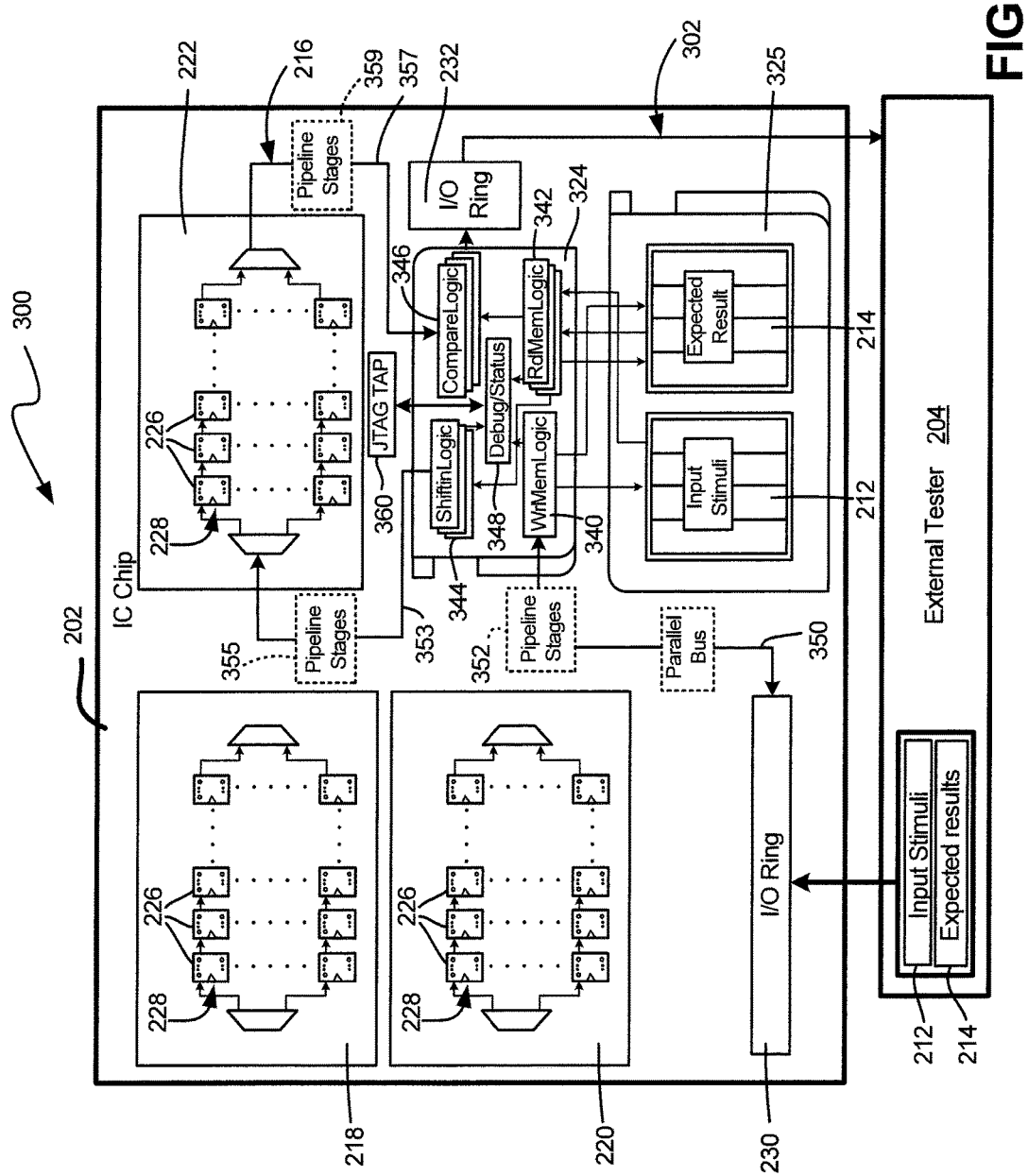
FIG. 3B is a block diagram of the second IC chip scan test setup of FIG. 3A with additional IC chip details.

FIG. 3B is a diagrammatic illustration of the test setup 300 of FIG. 3A with details of programmable block 324 and on-chip memory 325. As can be seen in FIG. 3B, block 324 includes several modules that carry out different scan test-related functions within IC chip 202. The modules include a Write Memory Logic module 340, a Read Memory Logic module 342, a Shift-in Logic module 344, a Compare Logic module 346 and a Debug Status Logic module 348.

Write Memory Logic module 340 is configured to read input stimuli 212 and expected results 214 from I/O ring 230 using, for example, a parallel bus. The Write Memory Logic module 340 is further configured to store the input stimuli 212 and the expected results 214 into on-chip memory 325, which may be, for example, a static random access memory (SRAM). In some embodiments, to address possible data skew (e.g., uneven distribution of input stimuli data 212 and expected result data 214) and timing conditions, one or more pipeline stages 352 may optionally be added in path 350 between I/O ring 230 and write memory logic module 340. Pipeline stages 352 may split input stimuli 212 and expected results 214 obtained via I/O ring into parallel data units to improve throughput. In different embodiments, either single or multiple parallel buses may be employed to fill banks of SRAM 325. The selection of either single or multiple parallel buses may depend on I/O availability, speed, physical distance, congestion, etc. Different parallel bus protocols may be implemented in different embodiments. One example of a parallel bus protocol is shown and described below in connection with Table 1 and FIG. 3C.

Table 1 below shows a parallel bus protocol to push data from an external tester such as 204 into an IC chip such as 202.

TABLE 1

| Serial Number | Field name | Field width | Communication direction | Field description |
|---|---|---|---|---|
| 1 | Ready | 1 | IC chip → tester | 1 = IC chip is ready to receive data<br>0 = IC chip is not ready to receive data |
| 2 | Data | 8 or any other number | tester → IC chip | Data |
| 3 | Valid | 1 | tester → IC chip | 1 = data are input stimuli<br>0 = data are expected results<br>Consecutive 1s are not allowed.<br>$2^{nd}$ 0 of consecutive 0s indicates an end of transfer of input stimuli and/or expected results. |

Figure 3C:
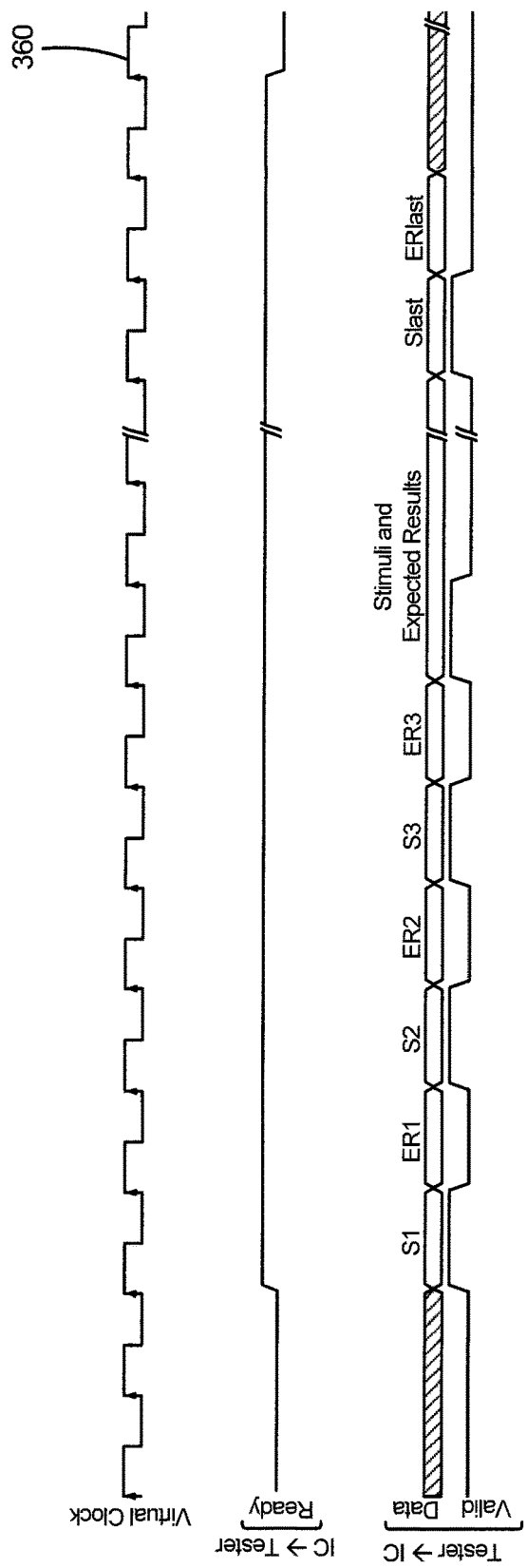
FIG. 3C is illustrates a tester-chip interface timing diagram obtained using an example protocol for carrying out an IC chip scan test with the second test setup of FIGS. 3A and 3B.

FIG. 3C illustrates an interface timing diagram for the protocol shown in Table 1. In FIG. 3C, virtual clock pulse 360 provides a timing reference for the data transfers shown. As can be seen in Table 1 and/or FIG. 3C, the Ready field is one bit wide and is used for communicating information from the IC chip 202 to the external tester 204. The communicated information is represented by either a 1, which indicates that the IC chip 202 is ready to receive data, or a 0 that indicates that the IC chip is not ready to receive data. The Data field having any suitable width is employed to send either input stimuli 212 or expected results 214 from the external tester 204 to the IC chip 202. The Valid field, which is 1 bit wide, is utilized to indicate whether the data are input stimuli 212 (e.g., by populating the Valid field with a 1) or expected results (e.g., by populating the Valid field with a 0). As can be seen in Table 1, the Valid field may also be utilized to indicate the end of a data transfer (e.g., by communicating two consecutive Valid fields that are each populated with a 0). In FIG. 3C, S1, S2 and S3 can by identified as input stimuli by the IC chip 202 because the Valid field sent from the external tester 204 along with the data includes a 1. Similarly, ER1, ER2 and ER3 can be identified as expected results by the IC chip 202 because the Valid field sent from the external tester 204 along with the data includes a 0. Also, the data transfers from the external tester 204 to the IC chip 202 occur when the Ready filed communicated from the IC chip 202 to the external tester 204 includes a 1.

Referring back to FIG. 3B, data received from the external tester 204 by the Write Memory Logic module 340 may be written to the on-chip memory 325 using different techniques. For example, if on-chip memory 325 comprises SRAM banks, a first technique may be to write to each physical memory location vertically (e.g., fill one SRAM bank at a time). Alternatively, the SRAM banks may be written to using data striping, which involves storing consecutive data segments in different SRAM banks. It should be noted that, in both these storage techniques, the input stimuli 212 and expected results 214 are stored independently without any conflict. To ensure that data conflict is avoided, the Write Memory Logic module 340 may include a counter that counts a number of input stimuli (e.g., a number of scan patterns) 212.

Read Memory Logic module 342 is configured to read stored input stimuli 212 and expected results 214 from on-chip memory (e.g., SRAM banks) 325. Read Memory Logic module 342 provides the input stimuli data 212 to Shift-in Logic module 344 for injection into the scan chains 228. Read Memory Logic module 342 also provides the expected results 214 to Compare Logic module 346 for comparison with scan chain outputs 216. In case of multiple partitions (e.g., multiple blocks such as 218, 220 and 222 in the IC chip 202) and multiple sets of scan chains 228 (e.g., scan chains in each of blocks 218, 220 and 222), the input stimuli data 212 and expected results 214 are substantially simultaneously provided to Shift-in Logic module 344 and Compare Logic module 346, respectively. Information regarding a number of input stimuli (e.g., a number of scan patterns) 212 to be read is provided to Read Memory Logic module 342 by Write Memory Logic module 340.

It should be noted that different strategies/techniques for reading data from on-chip memory 325 may be employed by Read Memory Logic module 342 depending on, for example, whether the on-chip memory 325 is a single port (SP) memory, a dual port (DP) memory or a combination of both SP and DP. A strategy employed to read a SP SRAM 325 may depend upon how the data to be read was written into the SP SRAM 325. If the data to be read was written into SP SRAM 325 by filling one SRAM band at a time, then read operations from, and write operations to, the SP SRAM 325 may not be performed concurrently. However, if SP SRAM 325 is written into using data striping, write/read throughput may be boosted by carrying out pseudo-simultaneous read/write operations. For example, a first memory bank of SP SRAM 325 may be read while a write operation is being carried out on a second memory bank of SP SRAM 325.

If on-chip memory 325 is a DP SRAM, write and read accesses to the DP SRAM 325 are mutually exclusive. Such mutually exclusive read and write access simplifies read/write logic employed in Write Memory Logic module 340 and Read Memory Logic module 342 since DP SRAM 325 is agnostic as to whether or not read and write operations are performed simultaneously. If on-chip memory 325 includes both SP SRAM and DP SRAM, the entire on-chip memory 325 may be treated as SP SRAM in the interest of design simplicity. However, in an alternative embodiment, SP SRAM and DP SRAM components may be operated separately using SP and DP logic, respectively.

Shift-in Logic module 344 is configured to receive the input stimuli 212 from the Read Memory Logic Module 342. Further, Shift-in Logic module 344 is configured to control clock-gating cells employed to shift scan data patterns that are a part of the input stimuli 212. Additionally, Shift-in Logic module 344 provides paths for the scan data patterns to be transported to the different sets of scan chains 228. Information regarding a number of input stimuli (e.g., a number of scan patterns) 212 to be injected into the scan chains 228 is provided to Scan-in Logic module 344 by Write Memory Logic module 340. Circuitry used to provide different input stimuli (e.g., scan patterns) to the different scan chains 228 may include, for example, a de-multiplexer that takes a single scan patterns 212 selected by Shift-in logic module 344 as an input and forwards the selected scan pattern 212 to one of many scan chains 228 that are connected to an output of the de-multiplexer. If such a de-multiplexer is physically substantially spaced apart from Shift-in Logic module 344, then to avoid timing errors, pipeline stages 355 may be added in path 353, which connects Shift-in Logic module 344 to programmable block 222. A number of pipeline stages 355 utilized is provided to Shift-in Logic module 344 to enable Shift-in Logic module 344 to relatively accurately control a clock enable signal of the clock gating cells.

Compare Logic module 346 is configured to monitor scan chain outputs 216 and compare the scan chain outputs 216 against the expected results 214 received from the Read Memory Logic module 342. Information regarding a number of input stimuli (e.g., a number of scan patterns) 212 for which corresponding expected results 214 need to be compared with scan chain outputs 216 is provided to Compare Logic module 346 by Write Memory Logic module 340. Circuitry used to provide scan chain outputs 216 to the Compare Logic module 346 may include, for example, multiplexers that select one of several scan chain outputs 216 and forward the selected scan chain output 216 to Compare Logic module 346. If such multiplexers are physically substantially spaced apart from Compare Logic module 346, then to avoid timing errors, pipeline stages 359 may be added in path 357, which connects programmable block 222 to Compare Logic module 346. A number of pipeline stages 359 utilized is provided to Compare Logic module 346 to enable Compare Logic module 346 to relatively accurately control a clock enable signal of the clock gating cells.

In operation, the Compare Logic module 346 determines whether each of the scan chains 228 has passed or failed the scan test. If an output 216 from a particular scan chain 228 does not match the expected result 214 for that chain 228, the Compare Logic module 346 determines that the scan chain 228 has failed, and stores identification information for the failed scan chain 228 along with the output 216 obtained and the expected result 214 for the chain 228. If the output 216 from the particular scan chain 228 matches the expected result 214 for that chain 228, the Compare Logic module 346 determines that the scan chain 228 has passed the test. As explained earlier, in one embodiment, the IC chip 202 provides the scan test result 302 to the external chip tester 204 by way of a two-bit vector. In such an embodiment, the two-bit vector is provided by Compare Logic module 346 within programmable block 324 of IC chip 202 to external tester 204 in a manner described above in connection with FIG. 3A.

Debug Status Logic module 348 assists in the detection of errors in logic of IC chip 202 in case the scan test result 302 has a failed status. Debug Status Logic module 348 captures and stores scan test information (e.g., a log or record including identification information related to different scan patterns injected into different scan chains and outputs obtained from the scan chains), which can be examined to relatively rapidly detect the errors in the logic of the IC chip 202. The identification information captured and stored by Debug Status Logic module 348 may include a clock cycle number, a block identifier (e.g., a unique identifier for a block 218, 220, 222) and a pin number that serves as an identifier for a scan chain 228 within a particular block 218, 220, 222. The identification information from Debug Status Logic module 348 may be read by external tester 204 via a suitable interface (e.g., a Joint Test Action Group (JTAG) interface) 360. The identification information enables rapid and precise location of the failure and generally eliminates any need for repeating the scan tests to narrow down the location of the failure.

Figure 4:
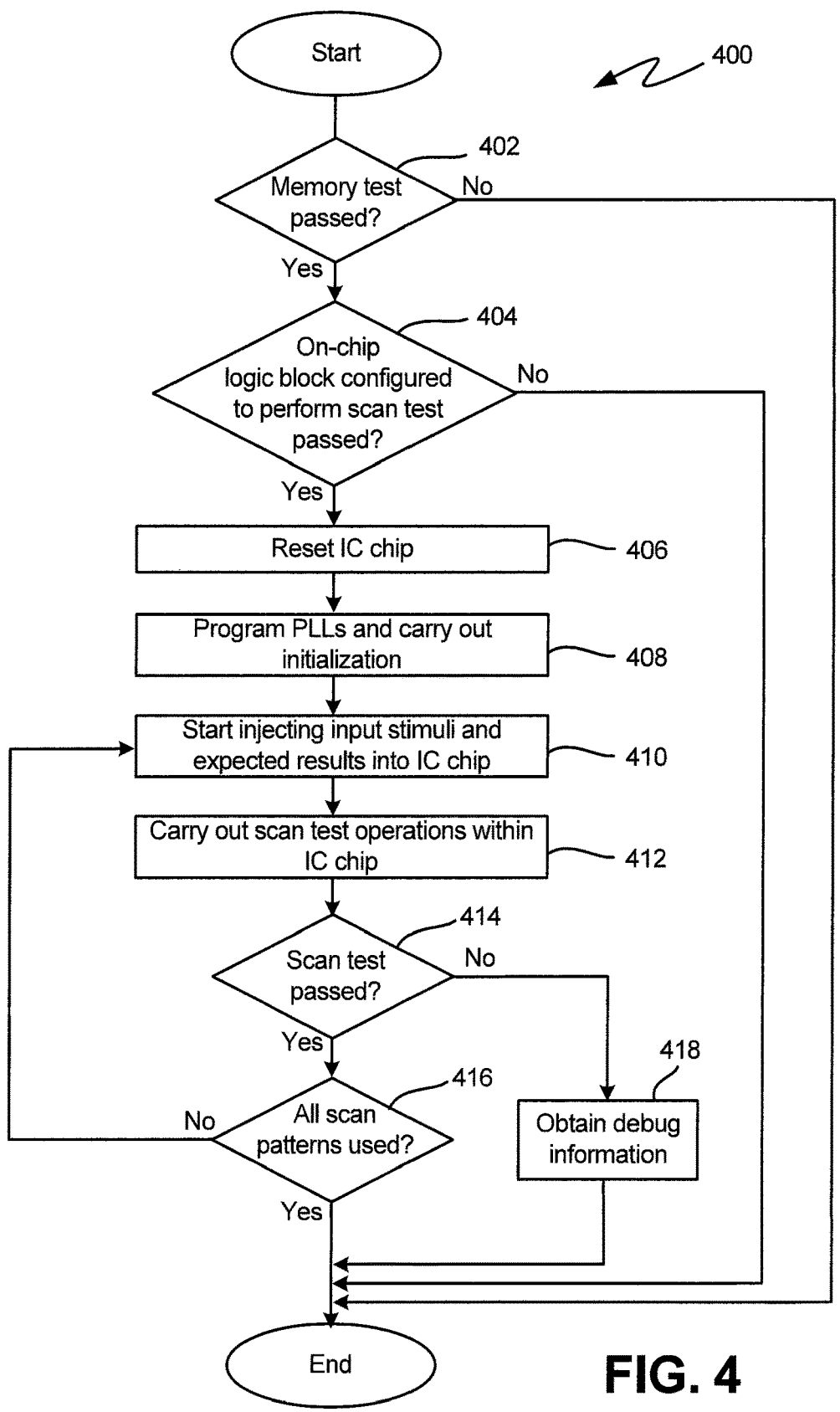
FIG. 4 is a flow diagram of a method embodiment.

FIG. 4 is a flow diagram 400 of a method embodiment for testing IC chip 202 using the second IC chip scan test setup 300 of FIG. 3B. At step 402, on-chip memory 325 is tested by carrying out, for example, a memory built-in self-test (MBIST). Such a test may be run by logic within the IC chip 202 that generates algorithms that, when executed, detect the presence of faults in on-chip memory 325. If memory 325 includes SRAM cells, the algorithms may detect whether one or more memory cells are stuck at a particular voltage value (e.g., a voltage value associated with either a 1 or a 0) or the cell voltage is slow to rise, slow to fall, etc. If the test carried out on the on-chip memory 325 fails, the process ends. If the test is successful, a next method step 404 is performed. At step 404, a scan test using, for example, the first IC chip scan test setup 200 (of FIGS. 2A and 2B) is carried out on programmable block 324, which includes different logic modules for performing on-chip scan test operations using the second IC chip scan test setup 300 shown in FIG. 3B. If block 324 fails the scan test, the process ends. If block 324 passes the test, the method proceeds to a next step 406. At step 406, the IC chip 302 is reset. Such a reset operation may involve, for example, initializing cells of the on-chip memory 325 to a predetermined value (e.g., setting all memory cells to 0 or setting all memory cells to 1). At step 408, programming of phase locked loops (PLLs), which supply the at-speed internal clock to the flops of the scan chains, and other scan setup-related initialization operations are carried out. As step 410, pumping of input stimuli 212 and expected results 214 from external tester 204 to IC chip 202 is commenced. The input stimuli 212 and expected results 214 may be sent from the external chip tester 204 to the IC chip 202 via a parallel bus. The above-described steps 402-410 involve providing at least some input to the IC chip 202 from an external element (e.g., external chip tester 204). However, at least some of the method steps described below are executed automatically within IC chip 202.

At step 412, the IC chip 202 receives the input stimuli 212 and the expected results 214 and utilizes the input stimuli 212 and the expected results 214 to automatically carry out internal scan test operations. As indicated above, the automatic scan test operations include receiving, by Write Memory Logic module 340, the input stimuli 212 and the expected results 214 from the external tester 204, and writing, by the Write Memory Logic module 340, the input stimuli 212 and the expected results 214 into the on-chip memory 325. The automatic scan test operations performed in the IC chip 202 further include reading, by the Read Memory Logic module 342, the input stimuli 212 and the expected results 214 from the on-ship memory 325. The input stimuli 212 read from the on-chip memory 325 are provided to the Shift-in Logic module 344, which injects the input stimuli into the scan chains 228. The expected results 214 read from the on-chip memory 325 are provided to Comparison Logic module 346, which also obtains outputs 216 from the scan chains 228 and compares those outputs 216 with the expected results 214. Based on the comparison of the scan chain outputs 216 and the expected results 214, Comparison Logic module 346 determines scan test results 302.

At step 414, if a "pass" result is obtained for the scan test, step 416 is carried out. At step 416, a determination is made as to whether all scan patterns have been injected from external tester 204 into IC chip 202. If all scan patterns have been injected, the process ends. If there are still remaining scan patterns that need to be injected from tester 204 into IC chip 202, control returns to step 410.

At step 414, if a "fail" result is obtained for the scan test, step 418 is carried out. Step 418 involves obtaining debug information from Debug Status Logic module 348 to help pinpoint where an error occurred in the logic of IC chip 202. After the debug information is obtained, the process ends.

The second IC chip scan test setup and operation described in connection with FIGS. 3A-3C and 4 has several advantages (e.g., time- and cost-saving advantages) over the first IC chip scan test setup and operation described in connection with FIGS. 2A and 2B. Some advantages are described below in connection with timing diagrams shown in FIGS. 5, 6A and 6B.

Figure 5:
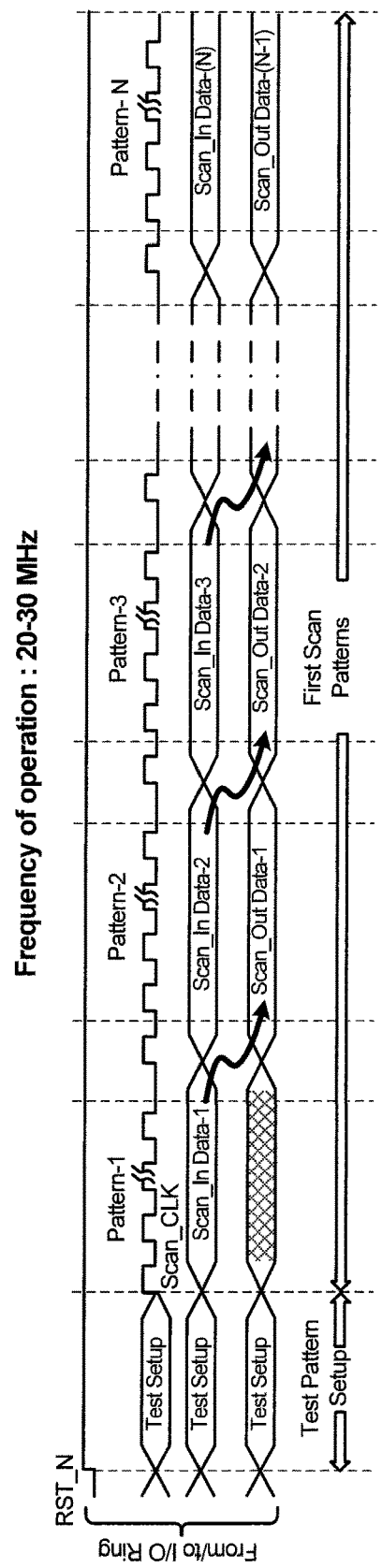
FIG. 5 is an example timing diagram of a first scan test carried out on an IC chip using the first IC chip scan test setup shown in FIGS. 2A and 2B.

FIG. 5 is an example timing diagram of a scan test carried out on an IC chip such as 202 using the first IC chip scan test setup shown 200 in FIGS. 2A and 2B. As described earlier, in the first IC chip scan test setup 200 shown in FIGS. 2A and 2B, external chip tester 204 applies input stimuli (e.g., scan patterns) to the IC chip 202 via I/O ring 230 and receives scan chain outputs 216 from the IC chip 202 via I/O ring 232. FIG. 5 shows examples of such input stimuli and scan chain outputs communicated via an I/O ring such as 230, 232 of the IC chip 202. In FIG. 5, the input stimuli include N number of scan patterns denoted by Scan_In Data-1, Scan_In Data-2, Scan_In Data-3, . . . , Scan_In Data-N. The outputs from different scan chains are denoted by Scan_Out Data-1, Scan_Out Data-2, . . . , Scan_Out Data-(N−1). In FIG. 5, a lag of one scan-in time period is present between the scan patterns and the corresponding scan chain outputs due to a time taken for a first scan pattern to be fully shifted into a scan chain before a first output is available. As explained above in connection with FIGS. 2A and 2B, the scan chain outputs 216 are compared with expected results 214 in the external tester 204, and the external tester 204 provides a scan test result. As noted earlier, for the first IC chip scan test setup 200 of FIGS. 2A and 2B, about 20,000-30,000 scan patterns may be employed to achieve desired test coverage for the IC chip 202, and shifting of scan patterns may be carried out at a frequency of about 20-30 MHz. In general, when the first test setup 200 is used to carry out the scan test, the test may take about 1-1.5 seconds to run on the external tester 204.

FIGS. 6A and 6B are example timing diagram portions showing scan patterns applied to an IC chip 200 and corresponding scan chain outputs for a scan test according to the method of FIG. 4, which is performed using the second IC chip scan test setup 300 shown in FIGS. 3A-3C. FIG. 6A illustrates an example timing diagram of a scan test on programmable block 324 (of FIG. 3B) in accordance with step 404 of FIG. 4. As described above in connection with FIG. 4, step 404 involves carrying out a scan test on programmable block 324 using the first test setup 200 of FIGS. 2A and 2B. Therefore, the timing diagram shown in FIG. 6A includes waveforms that are similar to the waveforms in the timing diagram of FIG. 5. However, for testing programmable block 324, M number of scan patterns (Scan_In Data 1, Scan_In Data-2, . . . Scan_In Data-M) are employed, where M is a substantially smaller number (e.g., a few hundred scan patterns) than the N (e.g., 20,000-30,000) scan patterns of FIG. 5. As in the case of FIG. 5, the scan operation shown in FIG. 6A is performed at a frequency of about 20-30 MHz. However, the operation completes in less than about 20-30 milliseconds due to M being substantially small.

FIG. 6B illustrates an example timing diagram of a scan test on relevant logic blocks (e.g., blocks 218, 220 and 222) in accordance with step 412 of FIG. 4. In FIG. 6B, S1, S2 and S3 represent input stimuli (e.g., scan patterns) and ER1, ER2 and ER3 represent expected results. As described earlier in connection with FIG. 3B, the input stimuli 212 and the expected results 214 are pumped into the IC chip 202 by the external tester 204 via the I/O ring 230 and stored into on-chip memory 325 with the help of logic in programmable block 324. Then, as indicated above, stored input stimuli S1, S2, S3, etc., are read from memory 325 by programmable block 324 and injected as scan patterns Scan_In Data-1, Scan_In Data-2, Scan_In Data-3, . . . , Scan_In Data-L into different scan chains 228. Programmable block 324 obtains outputs Scan_Out Data-1, Scan_Out Data-2, . . . , Scan_Out Data-(L−1) from the different scan chains 228, compares the scan chain outputs 216 with the expected results 204 and provides scan test results 302 to the external tester 204. The external tester 204 may receive only two signals: Scan_Status (when 1=Busy; when 0=Done) and Scan_Result (when 1=Pass; when 0=Fail). If both Scan_Status and Scan_Result signals go low, the debug feature is employed to identify a location or logic within the IC chip 202 at which the failure occurred. As indicated earlier, loading of scan patterns into the scan chains 228 is carried out at a high speed (e.g., 150-200 MHz) in the second IC chip scan test setup 300, which is possible because the loading operation takes place within the IC chip 202 by programmable block 324. Accordingly, carrying out the scan test by the method of FIG. 4 reduces overall scan test time by about 75% relative to the first IC chip scan test 200 carried out as shown in FIGS. 2A, 2B and 5. It should be noted that, in FIG. 6B, waveforms for the input stimuli (e.g., S1, S2 and S3) and the expected results (ER1, ER2 and ER3) are shown as being loaded into the IC chip in a serial fashion via I/O pins. However, if a relatively large number of I/O pins are available, the input stimuli and the expected results may be loaded in parallel into on-chip memory 325, thereby making the scan operation even faster. Table 2 below includes computations showing how scan test time may be reduced by utilizing the method of FIG. 4. As noted above, in the first IC chip scan test, N may be about 20,000-30,000. In the second IC chip scan test, M may be about 100-300 and L may be about 20,000-30,000.

TABLE 2

| Approach | | Frequency of operation (MHz) | Pattern Count | Chain Length (#Flops) | Test Time(uSec) |
|---|---|---|---|---|---|
| First scan test | | 30 | N | 1000 | (N*1000) * (1/30) |
| Second scan test | Programmable block 324 | 30 | M | 1000 | (M*1000) * (1/30) |
| | Programmable blocks other than 324 | 150 | L | 500 | (L*500)* (1/150) |

In Table 2 above, * denotes a multiplication operation. From Table 2 above, it is seen that a total time for the second IC chip scan test is substantially less than a time for the first IC chip scan test. As described above and seen in Table 2, the time for the second IC chip scan test is substantially less because certain scan test operations carried out outside the IC chip 202 in the first IC chip scan test are moved inside the IC chip 202 where they are carried out at a relatively high speed. Additional gains in speed in the second IC chip scan test me be obtained for reasons provided below.

An IC chip such as 202 may have high-speed I/O pins, which may be capable of transferring data at an upper limit of about 800 mega transfers per second (MTPS), and may also have low-speed I/O pins that may be capable of transferring data at an upper limit of about 70 MTPS. As noted above, in first IC chip scan test setup 200 of FIGS. 2A and 2B, the different scan chains are mapped to the different I/O pins of the IC chip 202 and therefore all of the I/O pins of the IC chip 202 may be utilized for the scan test. This limits the I/O frequency to that of the slowest I/O pin. However, in the second IC chip scan test setup 300 of FIGS.

3A and 3B, the different scan chains are not mapped to the different I/O pins of the IC chip 202 because the scan patterns are fed to the scan chains using the on-chip memory 325 and logic within programmable block 324. Therefore, in the second IC chip scan test setup 300, only a fraction of the I/O pins of the IC chip 202 may be employed to pump the scan patterns 212 and the expected results 214 into the IC chip 202. Accordingly, in the second IC chip scan test setup 300, only the high-speed I/O pins may be utilized to pump the scan patterns 212 and the expected results 214 into the IC chip 202, thereby further increasing the speed of the second IC chip scan test. Also, the inclusion of pipeline stages such as 355 and 359 shown in FIG. 3B may speed up the second scan test. Further, placement and configuration of logical elements and data transfer paths in IC chip 202 may be optimized for achieve speed gains in the second IC chip scan test.

In addition to the scan test speed gains obtained by using the second IC chip scan test setup 300, having on-chip Debug Status Logic module 348 is advantageous. As noted above, identification information obtained via Debug Status Logic module 348 enables rapid and precise location of an IC chip failure and generally eliminates any need for repeating the scan tests to narrow down a location of the failure.

It should be noted that that above-described IC chip scan testing embodiments may be employed to test any IC chip that includes adequate on-chip memory for the test. The use of the IC chip scan testing embodiments described above is not limited to IC chips for data storage devices.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method of testing an integrated circuit (IC) chip having a plurality of programmable blocks and at least one memory, the method comprising:
    configuring a first programmable block of the plurality of programmable blocks with scan test logic for carrying out a scan test on programmable bocks of the plurality of programmable blocks other than the first programmable block;
    generating first uncompressed scan patterns and first expected results for the scan test outside the IC chip;
    loading the first uncompressed scan patterns and the first expected results into the memory;
    injecting the first uncompressed scan patterns from the memory into the other programmable blocks of the IC chip;
    obtaining output responses of the other programmable blocks in response to the first uncompressed scan patterns, the output responses being obtained by shifting in the injected first uncompressed scan patterns through scan chains of the other programmable blocks and capturing responses of the scan chains from the shifting;
    comparing, by the scan test logic within the first programmable block, the output responses with the first expected results from the memory; and
    providing a scan test result based on the comparison between the output responses and the first expected results.

2. The method of claim 1 and further comprising testing the memory prior to loading the first uncompressed scan patterns and the expected results into the memory.

3. The method of claim 1 and further comprising testing the first programmable block prior to loading the first uncompressed scan patterns and the expected results into the memory.

4. The method of claim 3 and wherein testing of the first programmable block is carried out with second uncompressed scan patterns and second expected results that are not stored in the memory.

5. The method of claim 1 and wherein loading the first uncompressed scan patterns and the first expected results into the memory comprises receiving, by the scan test logic within the first programmable block, the first uncompressed scan patterns and the first expected results from input/output pins of the IC chip, and storing, by the scan test logic within the first programmable block, the first uncompressed scan patterns and the first expected results into the memory.

6. The method of claim 1 and further comprising recording, by the scan test logic within the first programmable block, scan test information for locating failed logic within the IC chip when the scan test result has a failed status.

7. The method of claim 1 and wherein injecting the first uncompressed scan patterns from the memory into the other programmable blocks of the IC chip comprises substantially simultaneously injecting, by the scan test logic within the first programmable block, different uncompressed scan patterns from the memory into different scan chains in the other programmable blocks.

8. The method of claim 7 and wherein comparing, by the scan test logic within the first programmable block, the output responses with the first expected results comprises substantially simultaneously comparing, by the scan test logic within the first programmable block, scan test outputs from the different scan chains with the first expected results.

9. The method of claim 1 and further comprising reading at least some of the first expected results from the memory when at least some of the first uncompressed scan patterns are being loaded into the memory.

10. An integrated circuit (IC) chip comprising:
a memory; and
a plurality of programmable blocks comprising a first programmable block having scan test logic configured to carry out a scan test on other ones of the plurality of programmable blocks,
the scan test logic is configured to:
receive uncompressed scan patterns and expected results from input/output pins of the IC chip;
load the uncompressed scan patterns and the expected results into the memory;
inject the uncompressed scan patterns from the memory into the other ones of the plurality of programmable blocks;
obtain output responses of the other programmable blocks in response to the uncompressed scan patterns by shifting in the injected uncompressed scan patterns through scan chains of the other programmable blocks and capturing responses of the scan chains from the shifting;
compare the output responses with the expected results from the memory; and
provide a scan test result based on the comparison between the output responses and the expected results.

11. The IC chip of claim 10 and wherein the scan test logic is further configured to record scan test information for locating failed logic within the IC chip when the scan test result has a failed status.

12. The IC chip of claim 10 and wherein the scan test logic is further configured to substantially simultaneously inject different ones of the uncompressed scan patterns from the memory into different scan chains in the other programmable blocks.

13. The IC chip of claim 12 and wherein the scan test logic is further configured to substantially simultaneously compare scan test outputs from the different scan chains with the expected results.

14. The IC chip of claim 10 and wherein the scan test logic is configured to read at least some of the expected results from the memory when at least some of the uncompressed scan patterns are being loaded into the memory.

15. A system comprising:
an integrated circuit (IC) chip under test, the IC chip comprising:
a plurality of input/output (I/O) pins, wherein the plurality of I/O pins include high speed I/O pins and low speed I/O pins;
a memory; and
a plurality of programmable blocks comprising a first programmable block having scan test logic configured to carry out the scan test operations internal to the IC chip on other ones of the plurality of programmable blocks, and configured to determine a scan test result; and
a tester communicatively coupled to the high speed I/O pins and not coupled to at least some of the low speed I/O pins,
the tester is configured to pump uncompressed scan patterns and expected results into the high speed I/O pins of the IC chip, and
the scan test logic is configured to:
receive the uncompressed scan patterns and the expected results from the I/O pins of the IC chip;
load the uncompressed scan patterns and the expected results into the memory;
inject the uncompressed scan patterns from the memory into the other ones of the plurality of programmable blocks;
obtain an output responses of the other programmable blocks in response to the uncompressed scan patterns by shifting in the injected uncompressed scan patterns through scan chains of the other programmable blocks and capturing responses of the scan chains from the shifting;
compare the output responses with the expected results from the memory; and
provide the scan test result based on the comparison between the output responses and the expected results.

16. The system of claim 15 and wherein the scan test logic is further configured to record scan test information for locating failed logic within the IC chip when the scan test result has a failed status.

17. The system of claim 15 and wherein the scan test logic is further configured to substantially simultaneously inject different ones of the uncompressed scan patterns from the memory into different scan chains in the other programmable blocks.

18. The system of claim 17 and wherein the scan test logic is further configured to substantially simultaneously compare scan test outputs from the different scan chains with the expected results.

* * * * *

UNITED STATES PATENT AND TRADEMARK OFFICE
CERTIFICATE OF CORRECTION

PATENT NO. : 10,353,001 B2
APPLICATION NO. : 15/611047
DATED : July 16, 2019
INVENTOR(S) : Rajesh Maruti Bhagwat et al.

Page 1 of 1

It is certified that error appears in the above-identified patent and that said Letters Patent is hereby corrected as shown below:

In the Claims

In Column (12), Line 6 of Claim 1, change "bocks" to --blocks--.

Signed and Sealed this
Seventh Day of April, 2020

Andrei Iancu
*Director of the United States Patent and Trademark Office*